United States Patent
Kumagai et al.

(10) Patent No.: US 6,455,899 B2
(45) Date of Patent: *Sep. 24, 2002

(54) SEMICONDUCTOR MEMORY DEVICE HAVING IMPROVED PATTERN OF LAYERS AND COMPACT DIMENSIONS

(75) Inventors: Takashi Kumagai, Chino; Masahiro Takeuchi, Sakata; Satoru Kodaira, Chino; Takafumi Noda, Sakata, all of (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 09/764,449

(22) Filed: Jan. 19, 2001

(30) Foreign Application Priority Data

Jan. 12, 2000 (JP) ........................ 2000-012457

(51) Int. Cl.⁷ .................... H01L 29/76; H01L 29/94; H01L 31/062; H01L 31/113; H01L 31/119
(52) U.S. Cl. .................. 257/369; 257/393; 257/903
(58) Field of Search .................. 365/154, 156, 365/161; 257/66, 67, 68, 69, 71, 334, 369, 393, 903, 904

(56) References Cited

U.S. PATENT DOCUMENTS

| | | | | |
|---|---|---|---|---|
| 5,404,030 A | * | 4/1995 | Kim et al. | 257/67 |
| 5,691,561 A | * | 11/1997 | Goto | 257/369 |
| 5,973,369 A | * | 10/1999 | Hayashi | 257/369 |
| 6,081,016 A | * | 6/2000 | Tanaka et al. | 257/377 |
| 6,160,298 A | * | 12/2000 | Ohkubo | 257/393 |

FOREIGN PATENT DOCUMENTS

| | | | |
|---|---|---|---|
| JP | 404162473 A | * | 6/1992 |
| JP | 10-41409 | | 2/1998 |
| JP | 410032263 A | * | 2/1998 |

OTHER PUBLICATIONS

U.S. patent application Ser. No. 09/736,386, Kumagai et al., filed Dec. 15, 2000.
M. Ishida et al., IEDM Technical Digest (1998). p. 203.

* cited by examiner

*Primary Examiner*—Olik Chaudhuri
*Assistant Examiner*—Hoai Pham
(74) *Attorney, Agent, or Firm*—Oliff & Berridge, PLC

(57) ABSTRACT

First and second gate electrode layers that are positioned in a first conductive layer, first and second drain-drain contact layers that are positioned in a second conductive layer, and first and second drain-gate contact layers that are positioned in a third conductive layer together form conductive layers for a flip-flop. A sub word line extends in the X-axis direction in the first conductive layer. A $V_{DD}$ wire is disposed extending in the X-axis direction in the second conductive layer. A main word line is disposed extending in the X-axis direction in the third conductive layer. A bit line, a bit line/, a $V_{SS}$ wire, and a $V_{DD}$ wire are disposed extending in the Y-axis direction in the fourth conductive layer.

17 Claims, 16 Drawing Sheets

SEMICONDUCTOR MEMORY DEVICE HAVING IMPROVED PATTERN OF LAYERS AND COMPACT DIMENSIONS

BACKGROUND OF THE INVENTION

1. Field of the Invention

The present invention relates to a semiconductor memory device such as static random access memory (SRAM).

2. Description of the Related Art

SRAM, which is one variety of semiconductor memory devices, does not require any refresh operation and thus can be used for implementing a simpler system with lower power consumption. That is why SRAM is suitable for use as memory in portable equipment such as cellular telephones. There is a demand for portable equipment that is even more compact, and the memory cell size of SRAM must be made smaller to address that demand.

SUMMARY OF THE INVENTION

An objective of the present invention is to provide a semiconductor memory device that makes it possible to reduce the size of memory cells.

One aspect of the present invention relates to a semiconductor memory device provided with a memory cell having an n-type first drive transistor, an n-type second drive transistor, a p-type first load transistor, a p-type second load transistor, an n-type first transfer transistor, and an n-type second transfer transistor, the semiconductor memory device comprising: a p-type well; an n-type well; a first conductive layer; a second conductive layer; a third conductive layer; and a fourth conductive layer, wherein:

the first conductive layer is formed on the p-type well and n-type well, the second conductive layer is formed on the first conductive layer, the third conductive layer is formed on the second conductive layer, and the fourth conductive layer is formed on the third conductive layer;

the first drive transistor, the second drive transistor, the first transfer transistor, and the second transfer transistor are positioned in the p-type well;

the first load transistor and the second load transistor are positioned in the n-type well;

a first gate electrode layer, a second gate electrode layer, and a sub word line are positioned in the first conductive layer;

a first drain-drain contact layer, a second drain-drain contact layer, a fist power line, a first contact pad layer, a second contact pad layer, and a third contact pad layer are positioned in the second conductive layer;

a first drain-gate contact layer, a second drain-gate contact layer, a main word line, a fourth contact pad layer, a fifth contact pad layer, and a sixth contact pad layer are positioned in the third conductive layer;

a first bit line, a second bit line, and a ground line are positioned in the fourth conductive layer;

the first gate electrode layer includes gate electrodes of the first drive transistor and the first load transistor the second gate electrode layer includes gate electrodes of the second drive transistor and the second load transistor;

the sub word line extends in the first direction;

the first drain-drain contact layer connects a drain of the first drive transistor to a drain of the first load transistor;

the second drain-drain contact layer connects a drain of the second drive transistor to a drain of the second load transistor the first and the second gate electrode layers are positioned between the first drain-drain contact layer and the second drain-drain contact layer, as seen in plan view of the memory cell;

the first power line is connected to a well contact region of the n-type well, a source of the first load transistor, and a source of the second load transistor;

the first contact pad layer is used for connecting the first bit line to a source/drain region of the first transfer transistor;

the second contact pad layer is used for connecting the second bit line to a source/drain region of the second transfer transistor;

the third contact pad layer is used for connecting a well contact region of the p-type well, a source of the first drive transistor, and a source of the second drive transistor to the ground line;

the first drain-gate contact layer connects the first drain-drain contact layer to the second gate electrode layer;

the second drain-gate contact layer connects the second drain-drain contact layer to the first gate electrode layer;

the main word line extends in the first direction;

the fourth contact pad layer is used for connecting the first bit line to the source/drain region of the first transfer transistor;

the fifth contact pad layer is used for connecting the second bit line to the source/drain region of the second transfer transistor;

the sixth contact pad layer is used for connecting the well contact region of the p-type well, the source of the first drive transistor, and the source of the second drive transistor to the ground line;

the first bit line extends in a second direction that crosses the first direction at right angle; and the second bit line extends in the second direction.

This aspect of the present invention is further provided with a gate electrode layer that forms gates of inverters, a drain-drain contact layer connecting together the drains of the inverters, and a drain-gate contact layer connecting the gate of one inverter to the drain of the other inverter. Three layers (a gate electrode layer, a drain-drain contact layer, and a drain-gate contact layer) are used in the fabrication of the flip-flop in accordance with the present invention. This makes it possible to simplify the pattern of each layer (by making them linear, by way of example), in comparison with a flip-flop formed by using two layers. Since the present invention makes it possible to simplify the pattern of each layer, it is therefor possible to create a semiconductor memory device having a memory cell size with dimensions of 4.5 $\mu m^2$ or less.

The first and the second gate electrode layers are positioned between the first drain-drain contact layer and the second drain-drain contact layer, as seen in plan view of the memory cell. It is therefore possible to dispose the source contact layer of the drive transistors and the third contact pad layer in the center of the memory cell. This increases the degree of freedom in forming the first and the second drain-gate contact layers, which further helps in reducing the memory cell size. Note that the source contact layer in accordance with the present invention is a conductive layer that is used for connecting the source of the drive transistor to a wiring layer.

The present invention disposes the conductive layers that are necessary for the structure of the semiconductor memory device in a well-balanced manner. It is therefore possible to improve the various attributes required of the semiconductor memory device, such as compact dimensions, reliability, stability, and speed.

This aspect of the present invention may further comprise a second power line, and the second power line may be disposed in the vicinity of the memory cell, the second power line may be positioned in the fourth conductive layer, and the second power line may be connected to the first power line. This aspect of the present invention makes it possible to reduce the resistance of the wiring between the power line and the n-type well of the memory cell, thus making it difficult for latch-up to occur.

The second power line may extend in the second direction, the first power line may extend in the first direction, the first power line may overlap the main word line on a different level, the first power line may have a branch portion that extends in the second direction, a seventh contact pad layer may be positioned in the third conductive layer, and the branch portion and the seventh contact pad layer may be used for connecting the first power line to the second power line. By providing such a branch line, the first power line can be connected to the second power line, even if the first power line overlaps the main word line, as seen in plan view of the memory cell. The seventh contact pad layer and the branch portion may be positioned above the well contact region of the n-type well. The memory cell is not formed above the the well contact region of the n-type well. Thus the present invention makes it possible to form the seventh contact pad layer and the branch portion without wasting space in the memory cell region. The present invention therefore makes it possible to ensure that the only wire that is necessary for fixing the potential of the n-type well is the second power line disposed in the vicinity of the memory cell, thus implementing a highly reliable semiconductor memory device without disturbing the miniaturization of the memory cell. Note that the n-type well contact region and the second power line could be disposed for each 32 cells or 64 cells, by way of example.

The first power line may extend in the first direction. Furthermore, the ground line may extend in the second direction. The first and the second gate electrode layers in accordance with the present invention may extend in the second direction. The first and the second drain-drain contact layers in accordance with the present invention may extend in the second direction. The third contact pad layer in accordance with the present invention may extend in the second direction.

The first gate electrode layer, the second gate electrode layer, the first drain-drain contact layer, and the second drain-drain contact layer may be disposed in parallel to one another and may each be formed in a linear pattern. The present invention makes it possible to simplify the patterning and thus fabricate a semiconductor memory device with a very small memory cell size.

DESCRIPTION OF PREFERRED EMBODIMENT

An embodiment of a semiconductor memory device in accordance with the present invention is described below. In this embodiment of the present invention, the semiconductor memory device is applied to SRAM. An outline of the configuration of this embodiment of the invention is given first, then follows a more detailed description thereof, and finally the main effects of this embodiment of the invention are discussed.

[Outline of Configuration of This Embodiment]

A semiconductor memory device in accordance with this embodiment of the invention is of a type wherein one memory cell is configured of six MOS field-effect transistors. This outline is divided into the configuration of a portion that forms a flip-flop for a memory cell and the configuration of the memory cell.

{Configuration of Flip-flop Components within Memory Cell}

Figure 1:
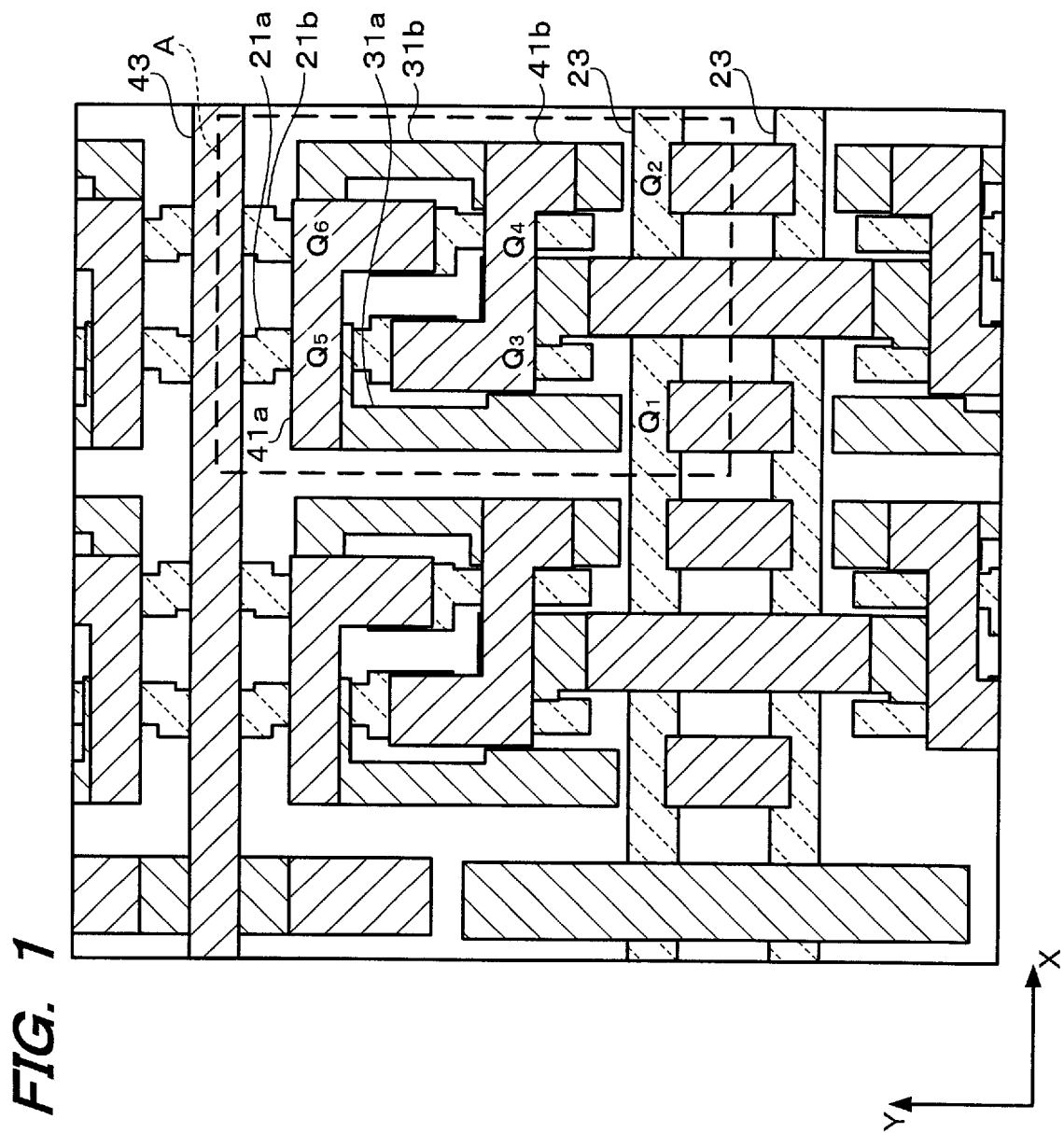
FIG. 1 is a plan view of a first conductive layer, a second conductive layer, and a third conductive layer in a part of a memory cell array in accordance with an embodiment of the present invention.

A plan view of first, second, and third conductive layers of part of a memory cell array in accordance with this embodiment of the invention is shown in FIG. 1. For the purpose of making FIG. 1 easier to be understood, the descriptions of the first, second, and third conductive layers are separated.

Figure 3:
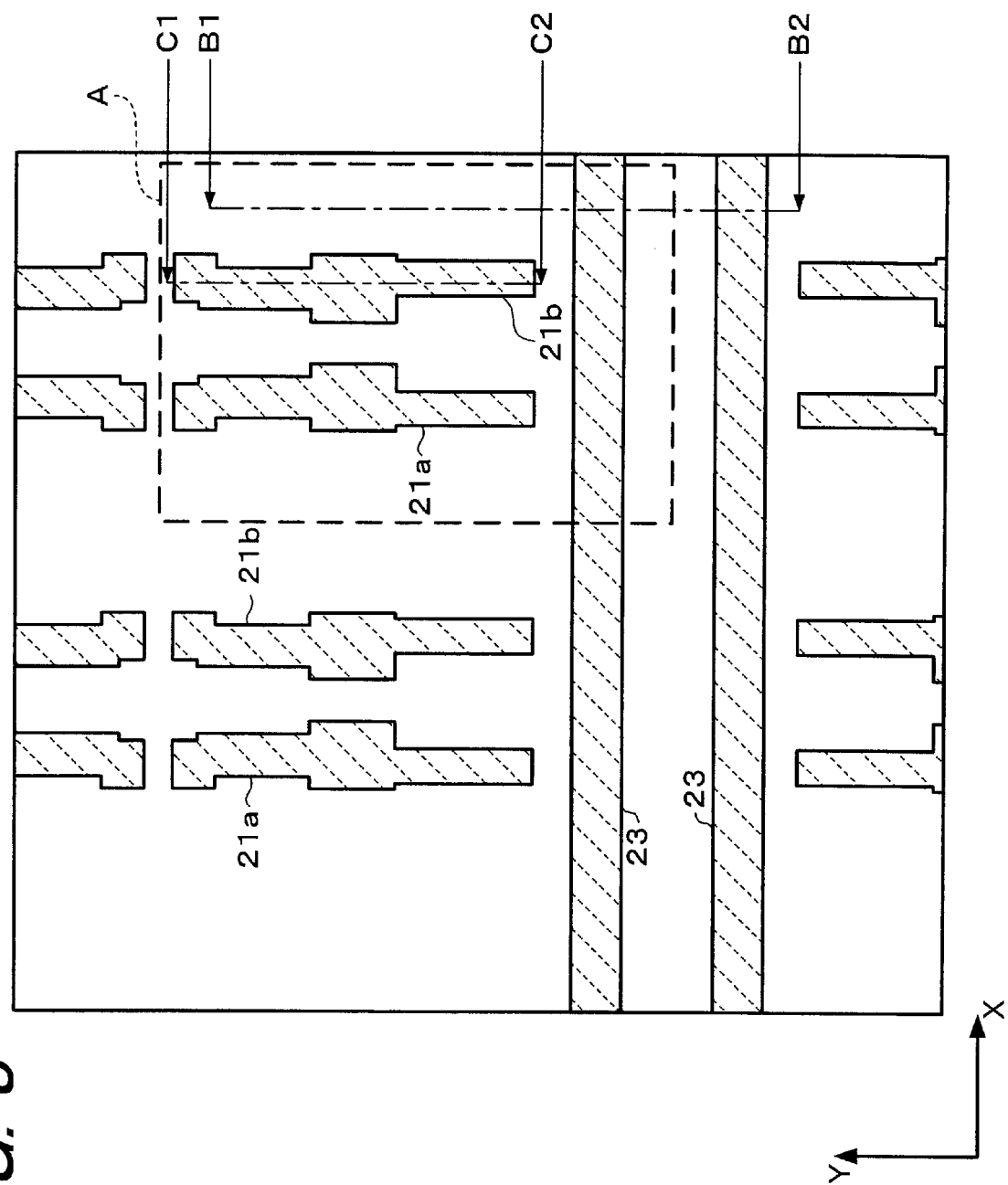
FIG. 3 is a plan view of the first conductive layer in this part of the memory cell array in accordance with this embodiment of the invention.
Figure 5:
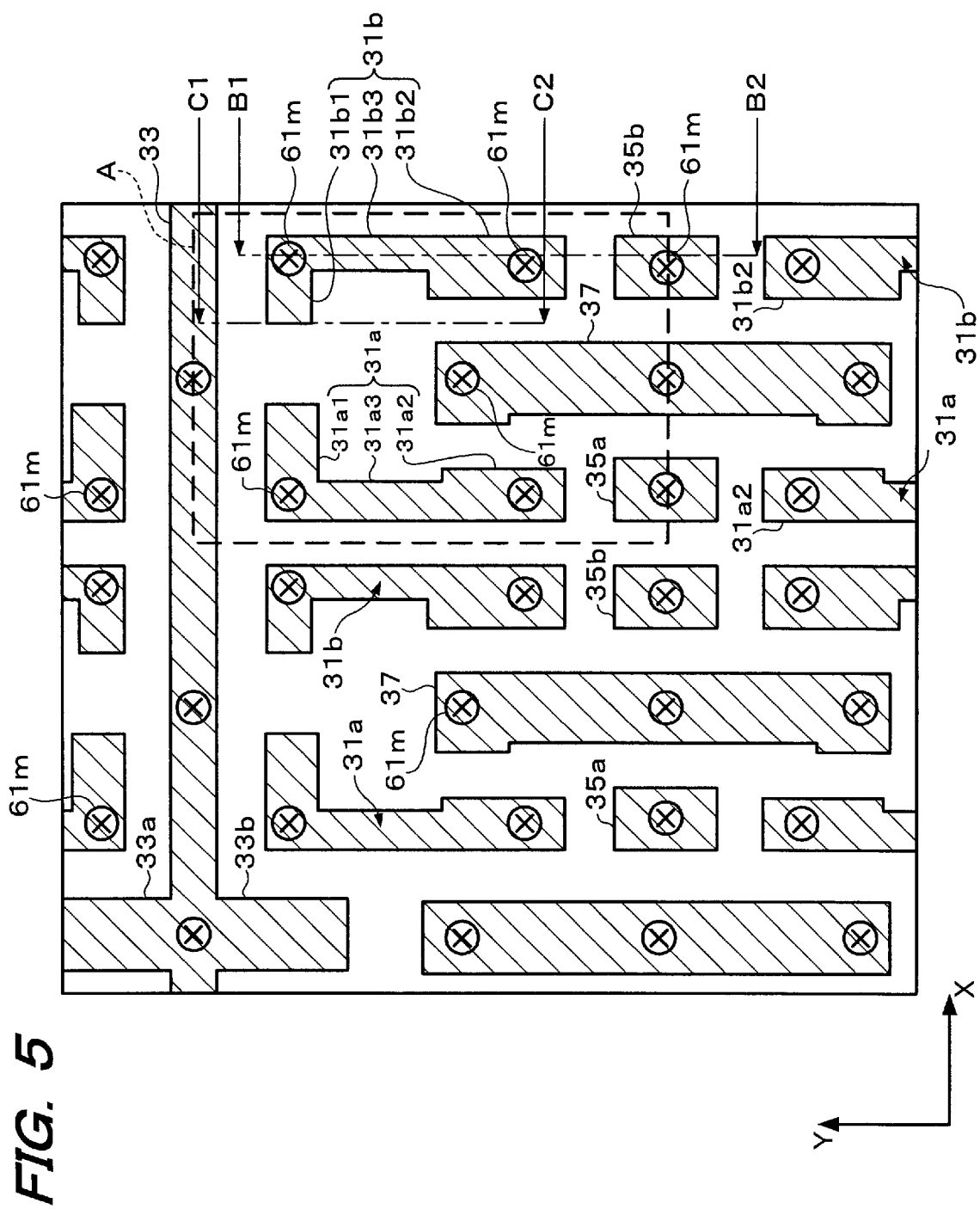
FIG. 5 is a plan view of the second conductive layer in this part of the memory cell array in accordance with this embodiment of the invention.
Figure 8:
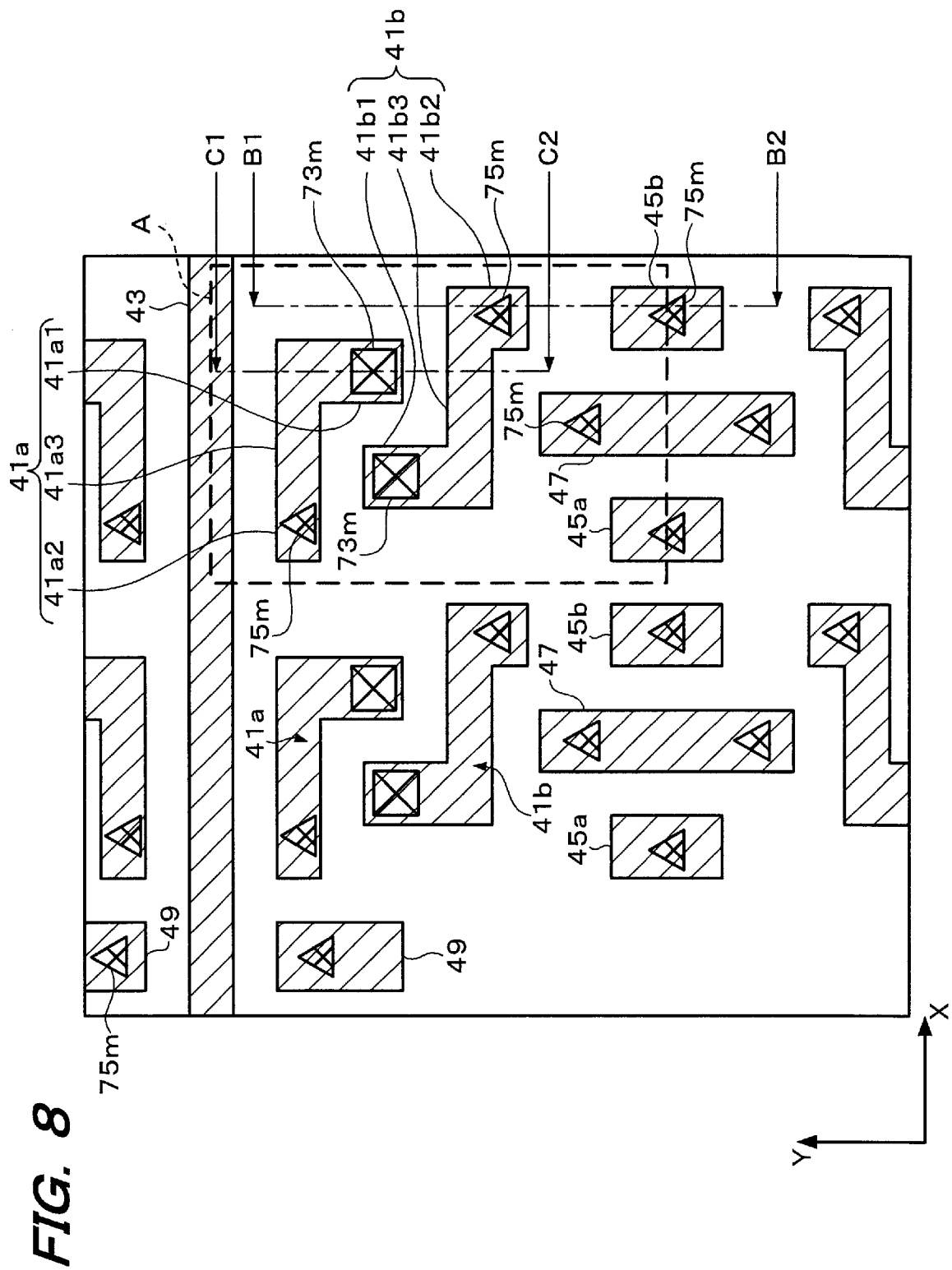
FIG. 8 is a plan view of the third conductive layer in this part of the memory cell array in accordance with this embodiment of the invention.

Gate electrode layers 21*a* and 21*b* and sub word lines 23 are made of the first conductive layer, as shown in FIG. 3. Drain-drain contact layers 31*a* and 31*b* are made of the second conductive layer, as shown in FIG. 5. Drain-gate contact layers 41*a* and 41*b* are made of the third conductive layer, as shown in FIG. 8. The structure shown in FIG. 5 is positioned above the structure shown in FIG. 3, then the structure shown in FIG. 8 is positioned above the structure of FIG. 5. These structures are shown together in FIG. 1.

A portion that configures a flip-flop is shown in FIG. 1. This will be described below, concentrating on a region A. One memory cell is formed in region A. References to region A in other figures have the same meaning.

Within region A are formed MOS field-effect transistors, in other words, two n-channel transfer transistors $Q_1$ and $Q_2$, two n-channel drive transistors. $Q_3$ and $Q_4$, and two p-channel load transistors $Q_5$ and $Q_6$. One CMOS inverter is formed from the drive transistor $Q_3$ and the load transistor $Q_5$. Another CMOS inverter is formed from the drive transistor $Q_4$ and the load transistor $Q_6$.

Figure 16:
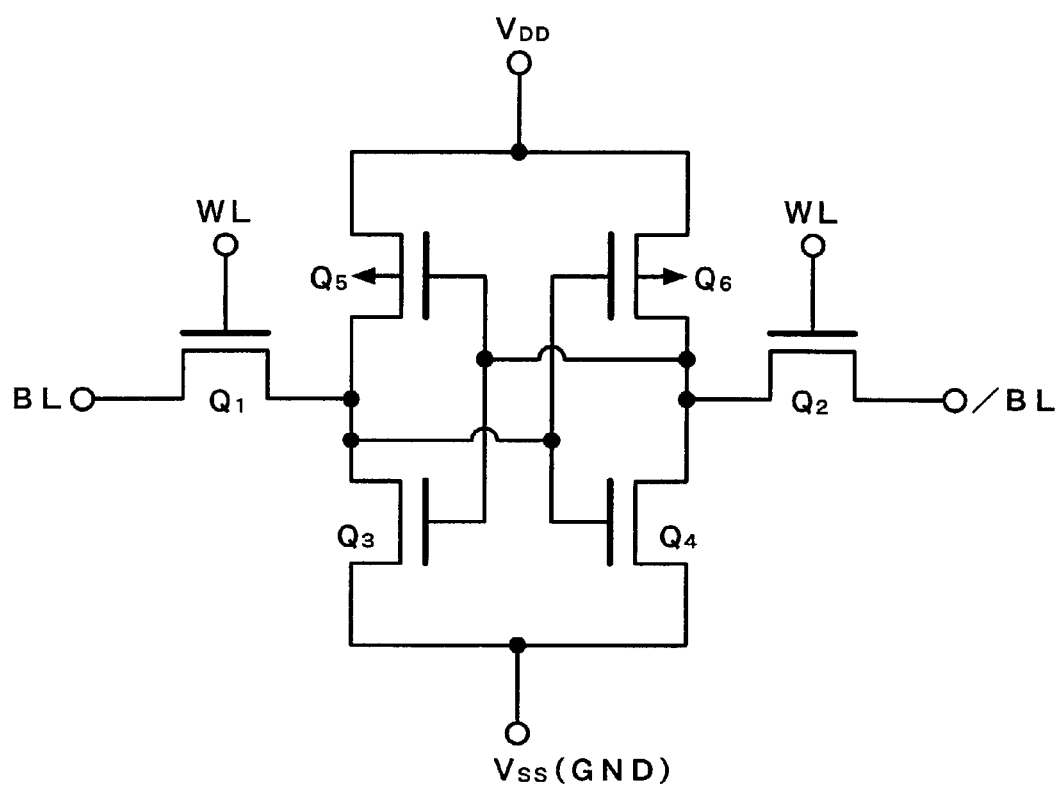
FIG. 16 is an equivalent circuit of SRAM in accordance with this embodiment.

A flip-flop is formed by cross-coupling these two CMOS is inverters. The circuits configured by the six MOS field-effect transistors that are in region A form an equivalent circuit such as that shown in FIG. 16.

Referring once more to FIG. 1, each of the gate electrode layer 21a and the gate electrode layer 21b has a linear shape. The gate electrode layer 21a forms gate electrodes for the drive transistor $Q_3$ and the load transistor $Q_5$, and it also connects those gate electrodes together. Similarly, the gate electrode layer 21b forms gate electrodes for the drive transistor $Q_4$ and the load transistor $Q_6$, and it also connects those gate electrodes together.

The drain of the drive transistor $Q_3$ and the drain of the load transistor $Q_5$ are connected by a drain-drain contact layer 31a. Similarly, the drain of the drive transistor $Q_4$ and the drain of the load transistor $Q_6$ are connected by a drain-drain contact layer 31b. Each of the drain-drain contact layer 31a and the drain-drain contact layer 31b has a linear shape.

The gate electrodes of the drive transistor $Q_3$ and the load transistor $Q_5$ (i.e., the gate electrode layer 21a) are connected to the drain-drain contact layer 31b by a drain-gate contact layer 41b. Similarly, the gate electrodes of the drive transistor $Q_4$ and the load transistor $Q_6$ (i.e., the gate electrode layer 21b) are connected to the drain-drain contact layer 31a by a drain-gate contact layer 41a. The drain-gate contact layers 41a and 41b form an L-shaped pattern, respectively. The angle subtended by a first side and a second side of each of these patterns is substantially 90 degrees. The first side of the drain-gate contact layer 41a faces the first side of the drain-gate contact layer 41b. The second side of the drain-gate contact layer 41a faces the second side of the drain-gate contact layer 41b. The first and the second sides of the drain-gate contact layer 41a and the first and the second sides of the drain-gate contact layer 41b are rotationally symmetrical.

The gate electrode layer 21a, the gate electrode layer 21b, the drain-drain contact layer 31a, and the drain-drain contact layer 31b are disposed in parallel to one another. The gate electrode layers 21a and 21b are positioned between the drain-drain contact layer 31a and the drain-drain contact layer 31b.

{Memory Cell Configuration}

Figure 10:
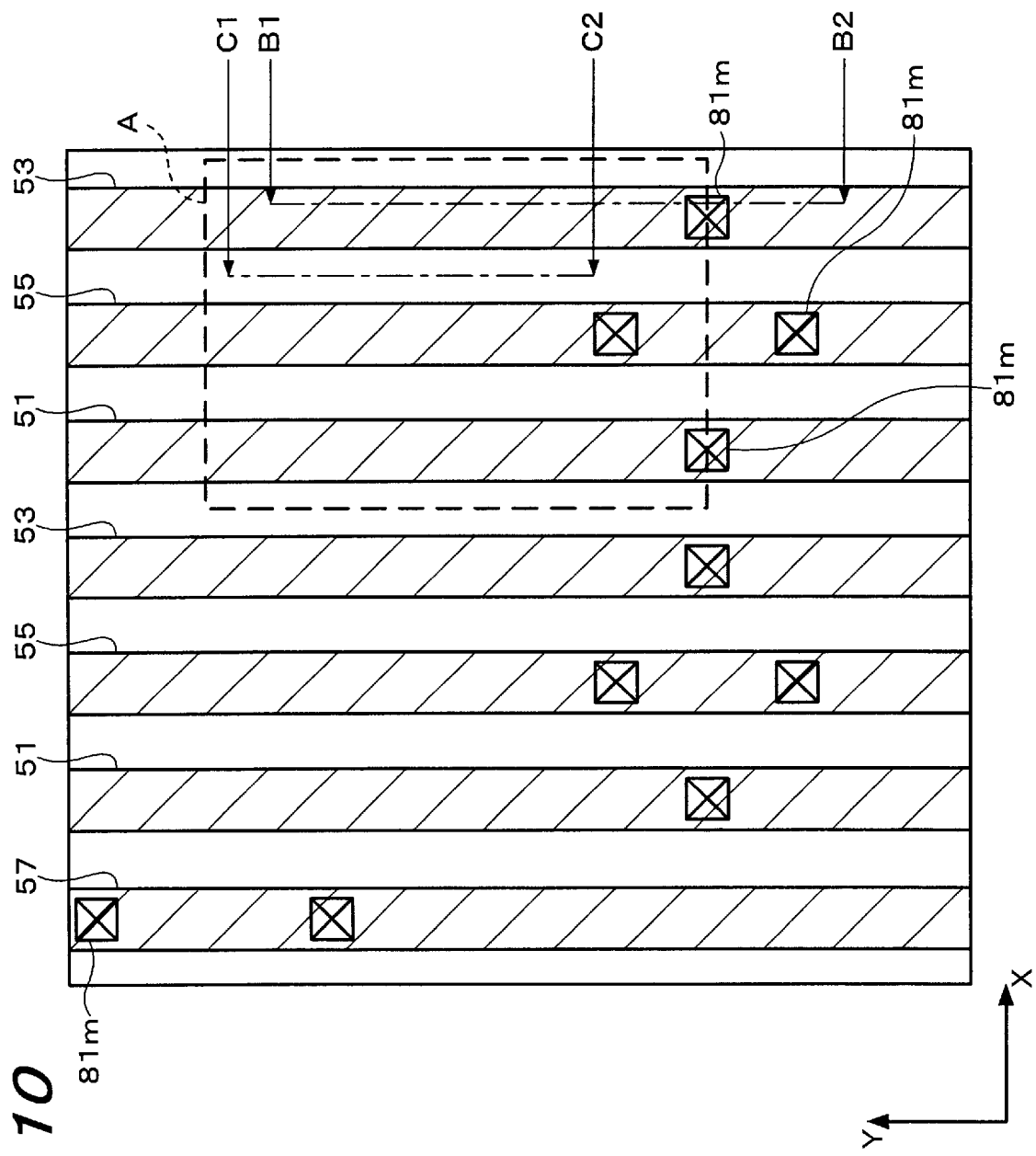
FIG. 10 is a plan view of the fourth conductive layer in this part of the memory cell array in accordance with this embodiment of the invention.

The description now turns to the configuration of the memory cell of this embodiment of the invention. The memory cell of this embodiment has a configuration in which first, second, third, and fourth conductive layers are formed in sequence on a field, with interlayer dielectrics therebetween. This field is a region in which active regions 11, 13, 15, and 17 and element isolation regions 19 are positioned. The fourth conductive layer is a layer in which components such as bit lines 51 are positioned, as shown in FIG. 10. The memory cell of this embodiment of the invention is configured in such a manner that the first, second, and third conductive layers that were described previously with reference to FIG. 1 are positioned on the field shown in FIG. 2, then the fourth conductive layer shown in FIG. 10 is positioned above these layers.

[Detailed Configuration of This Embodiment]

Figure 12:
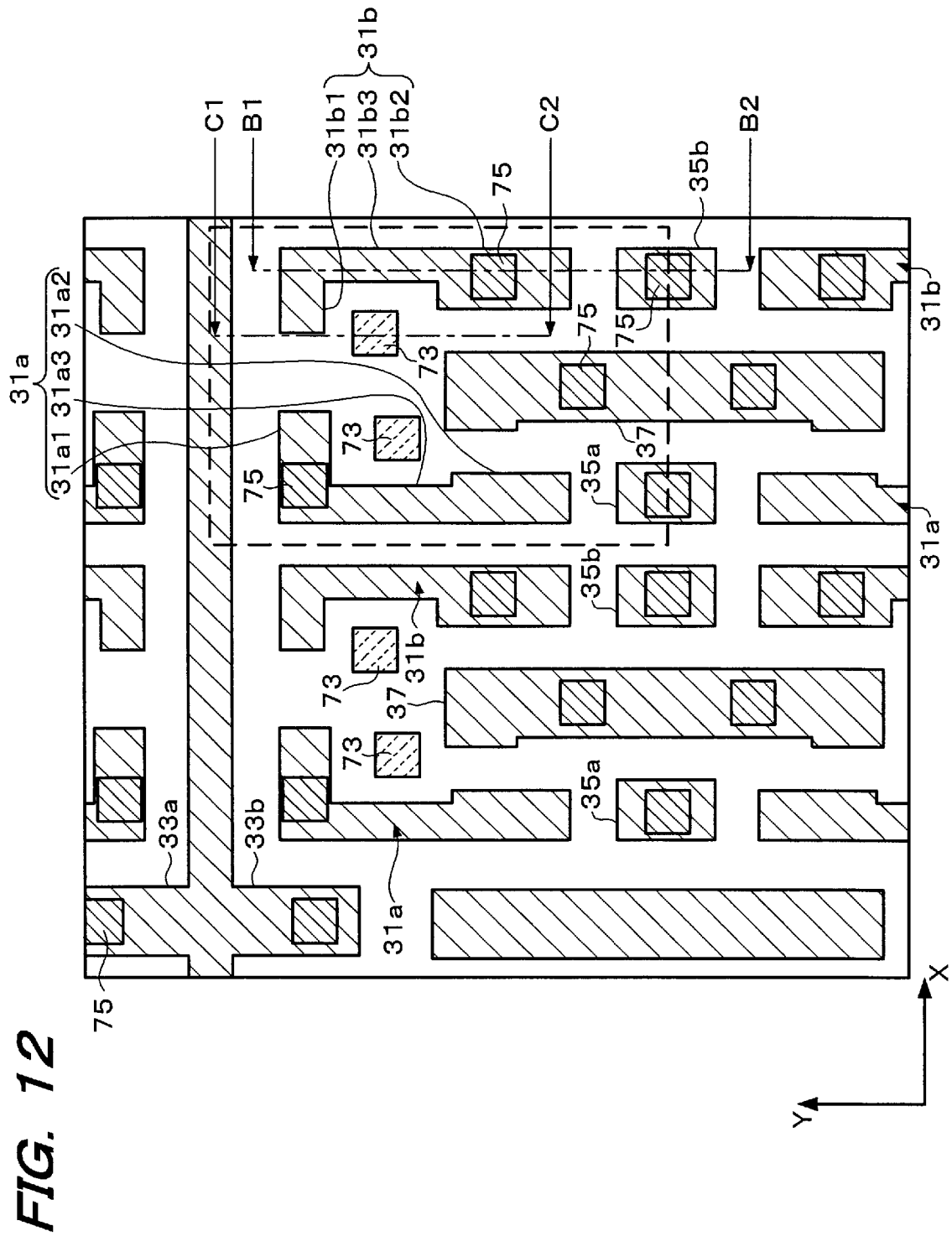
FIG. 12 is a plan view of the second conductive layer and the plugs of this embodiment of the invention.
Figure 13:
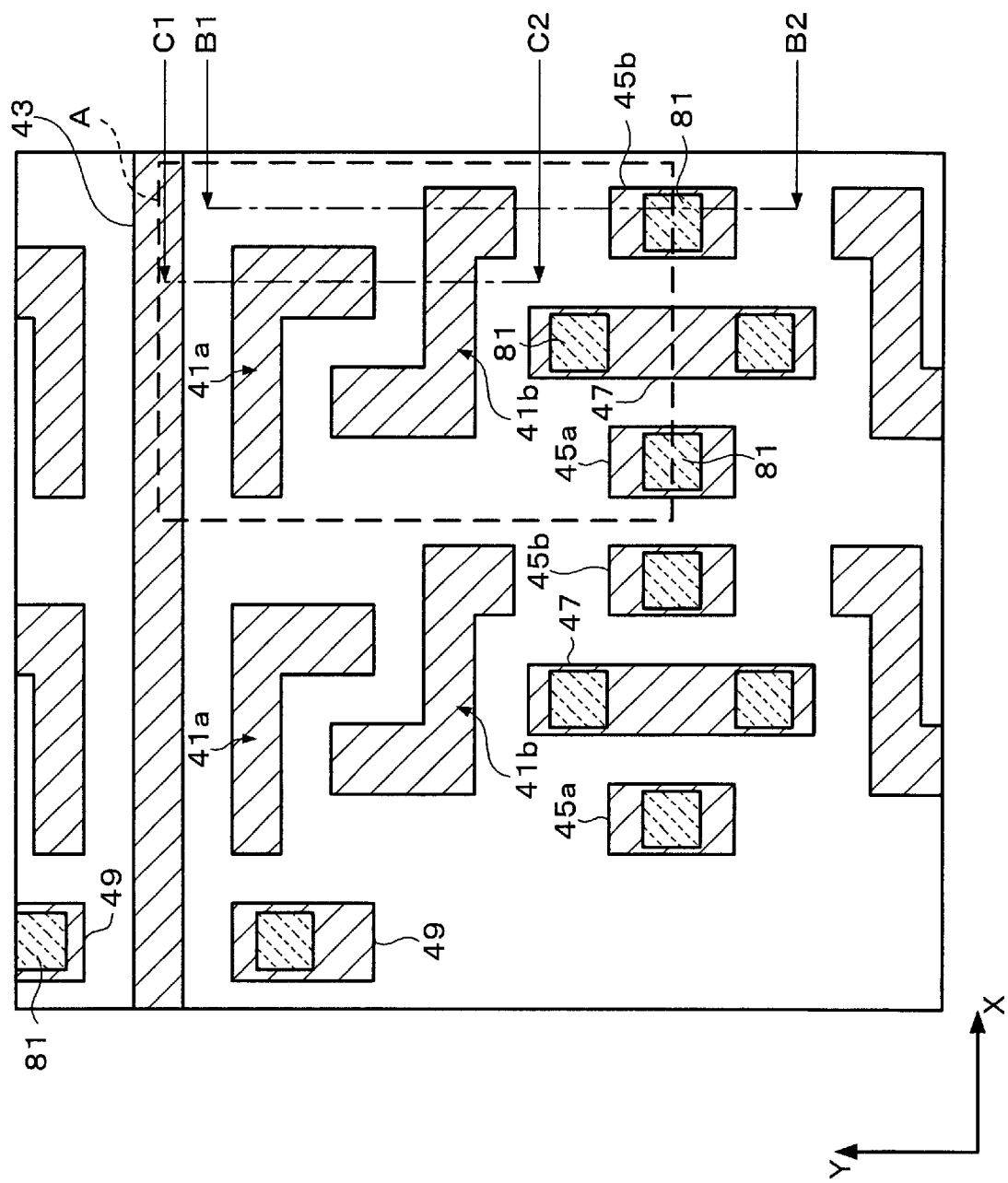
FIG. 13 is a plan view of the third conductive layer and the plugs of this embodiment of the invention.
Figure 14:
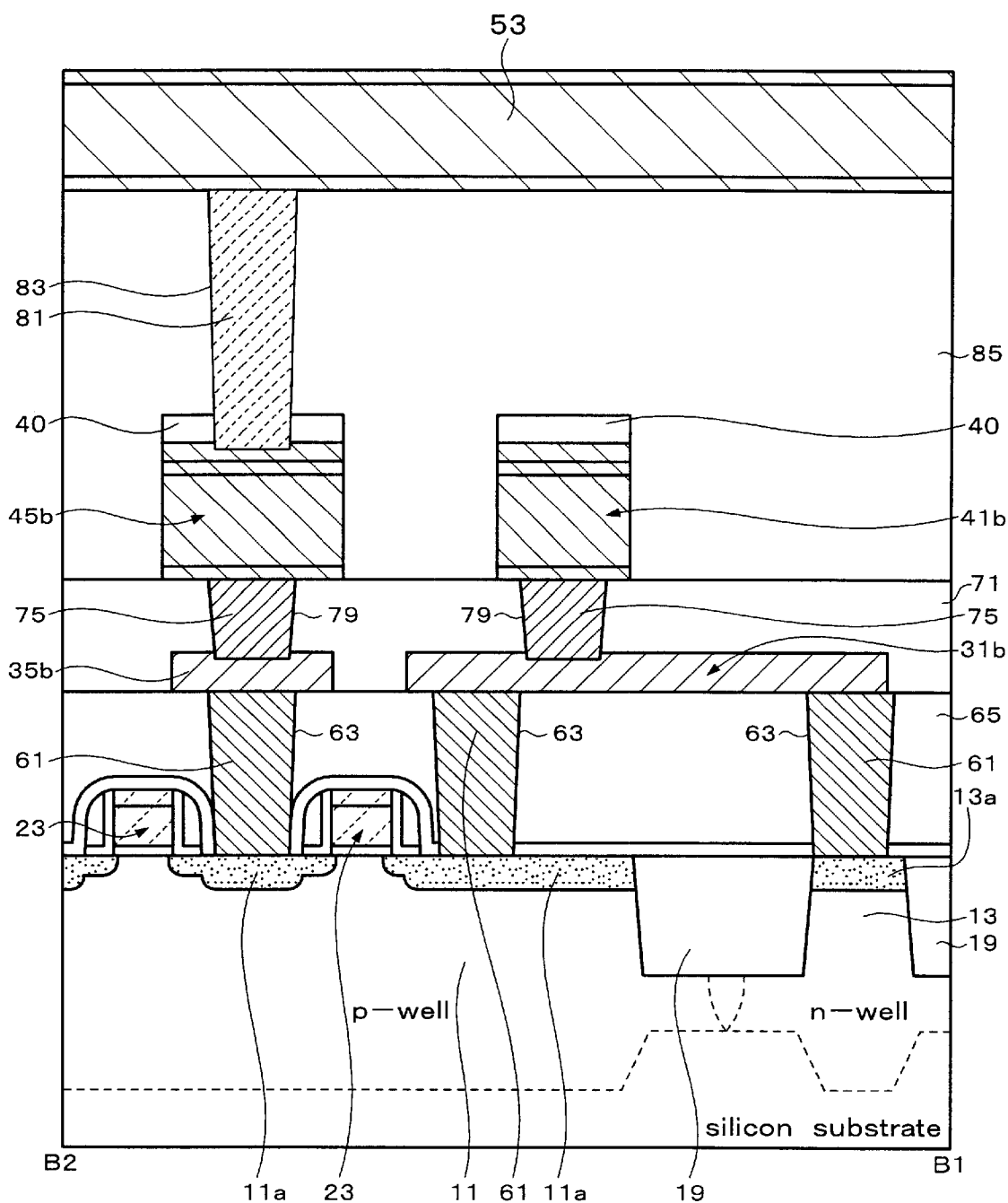
FIG. 14 is a section taken along the line B1–B2 of the plan view of this embodiment.
Figure 15:
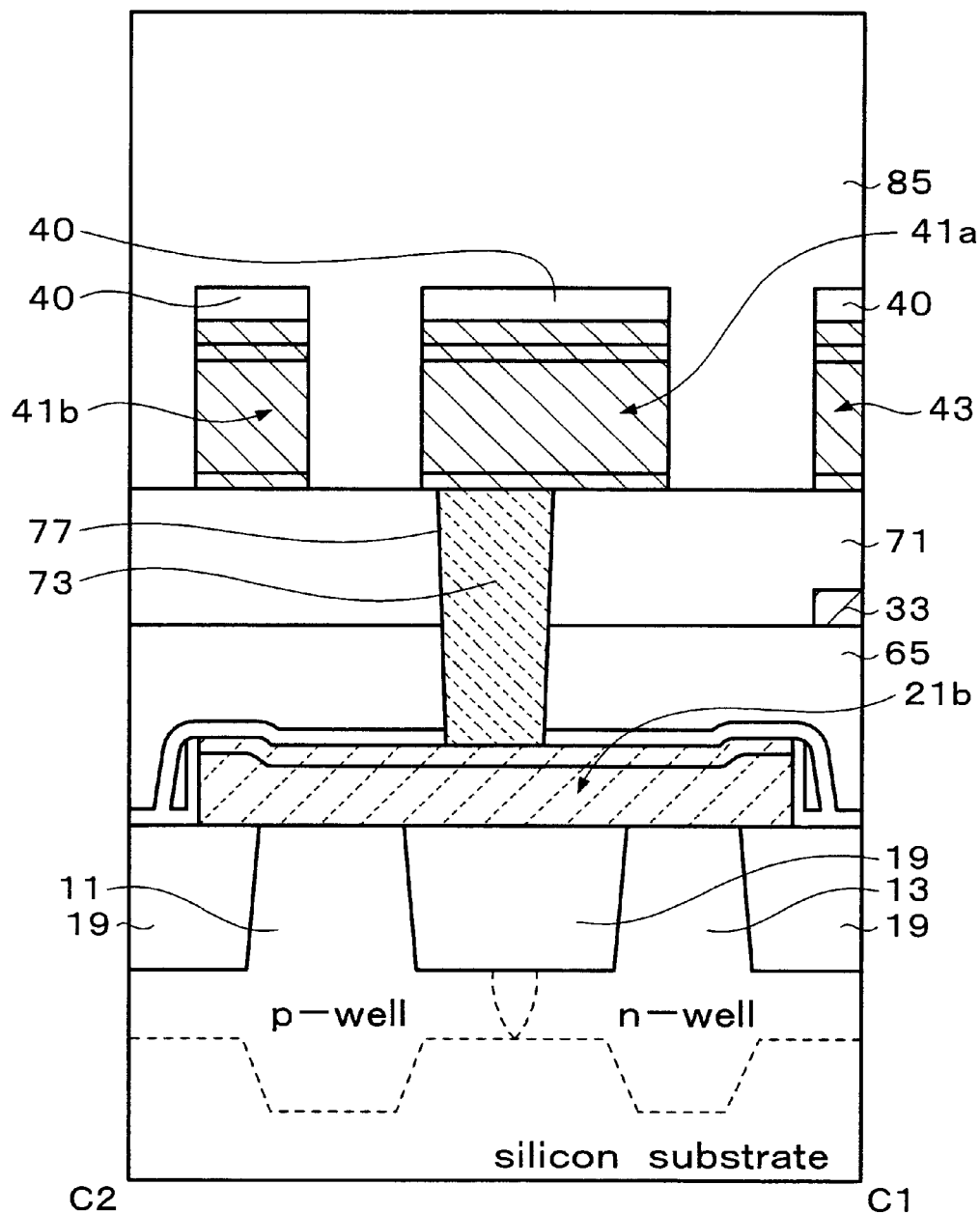
FIG. 15 is a section taken along the line C1–C2 of the plan view of this embodiment.

Details of the configuration of this embodiment of the invention will now be described with reference to FIGS. 2 to 15, in sequence from the lowermost layer. Note that lines B1–B2 and C1–C2 are shown in FIGS. 2 to 13. A section taken along the line B1–B2 is shown in FIG. 14 and a section taken along the line C1–C2 is shown in FIG. 15.

{Field and First Conductive Layer}

Figure 2:
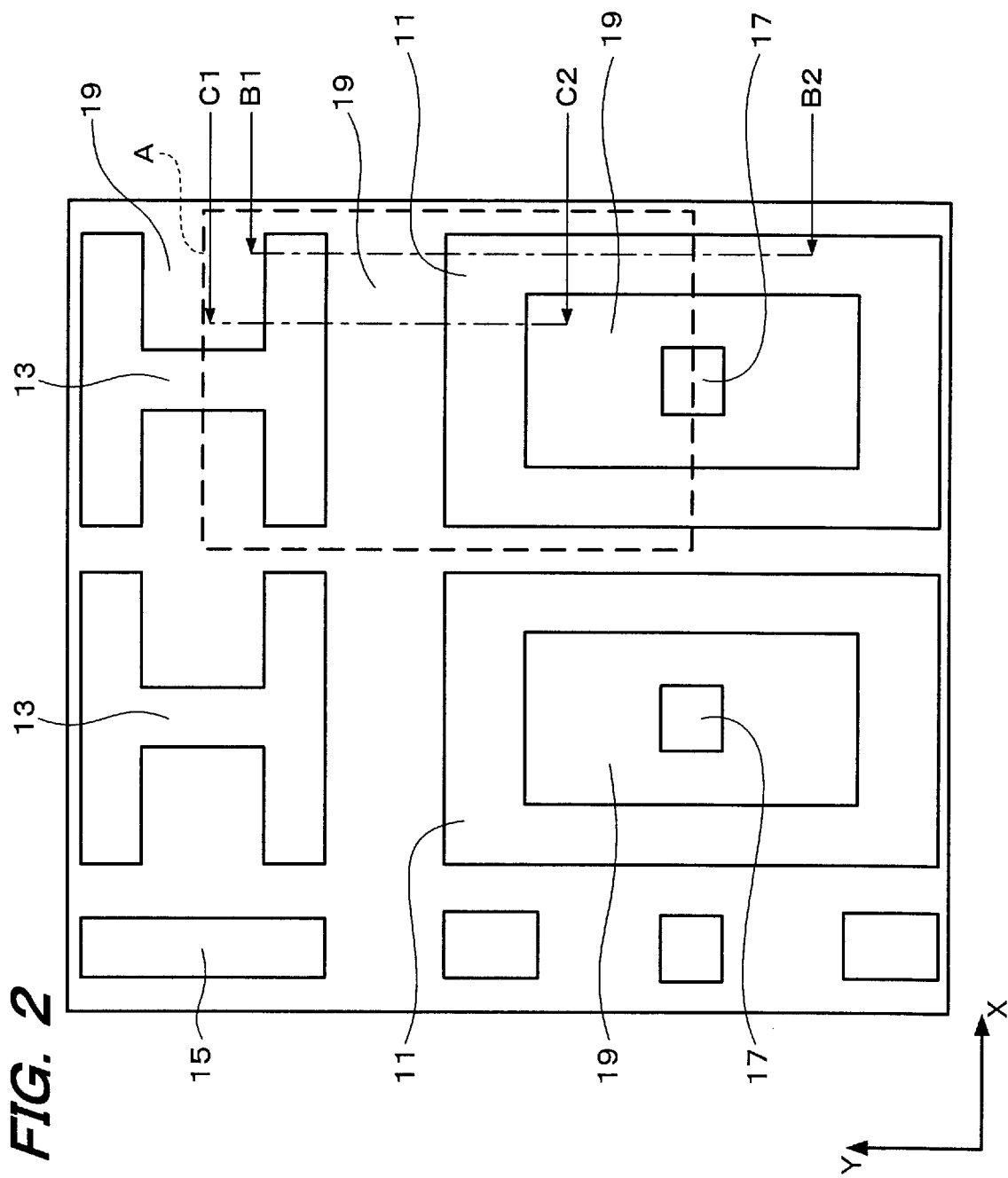
FIG. 2 is a plan view of a field in this part of the memory cell array in accordance with this embodiment of the invention.
Figure 11:
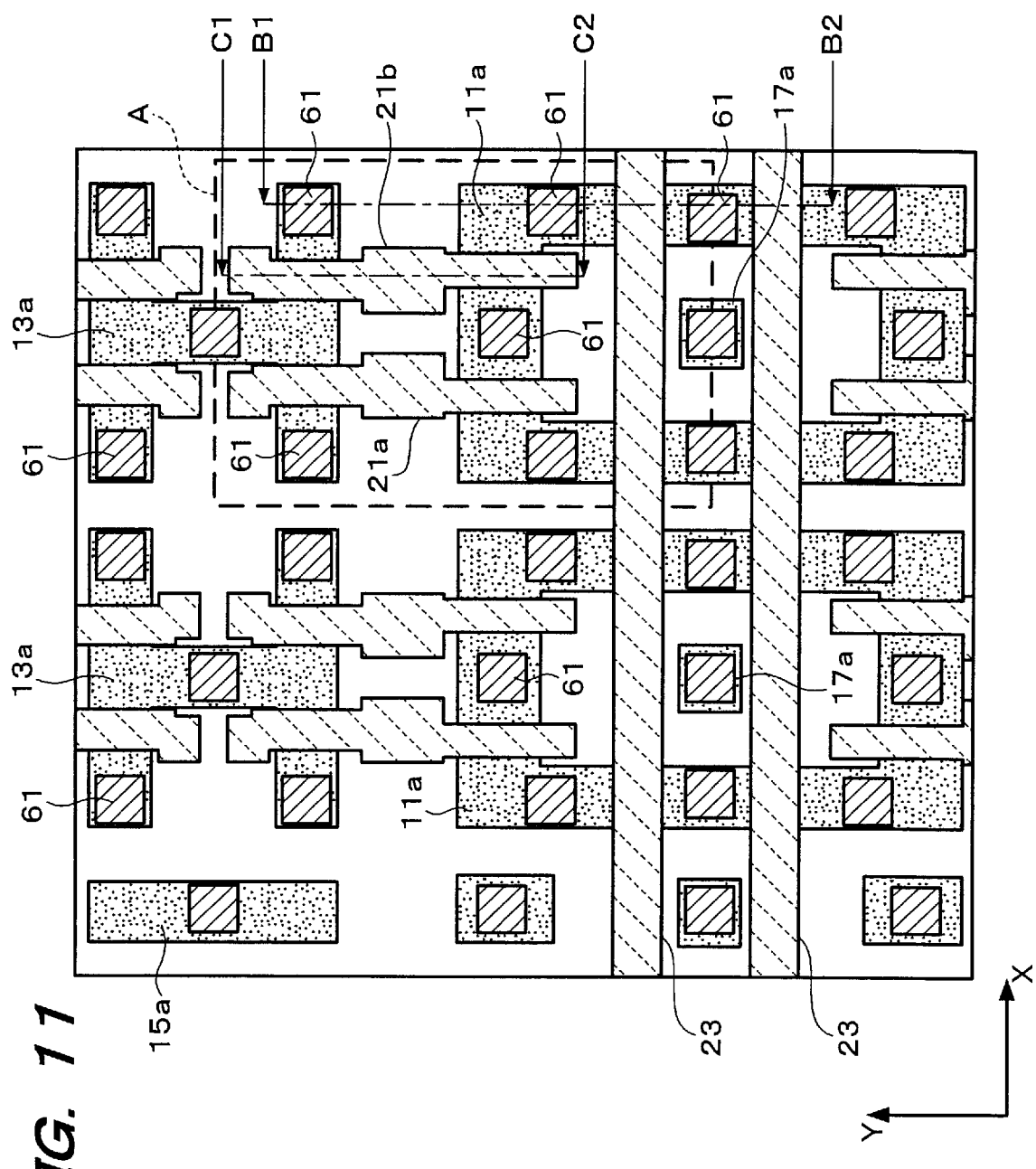
FIG. 11 is a plan view of the field, the first conductive layer, and the plugs of this embodiment of the invention.

A plan view of the field and the first conductive layer is shown in FIG. 11. First of all, the field will be described with reference to FIGS. 2, 14, and 15. FIG. 2 is a plan view of the field. The field has the active regions 11, 13, 15, and 17 and the element isolation regions 19. The active regions 11, 13, 15, and 17 are formed in the upper surface of a silicon substrate.

Each active region 11 is substantially box-shaped. A plurality of these active regions 11 is arrayed in the X-axis direction in FIG. 2. The transfer transistors $Q_1$ and $Q_2$ and the drive transistors $Q_3$ and $Q_4$ of FIG. 1 are formed in each active region 11.

Each active region 13 is substantially H-shaped. A plurality of these active regions 13 is arrayed in the X-axis direction in FIG. 2. The load transistors $Q_5$ and $Q_6$ are formed in each active region 13.

One active region 15 is formed for each group of a number of memory cells, such as 32 memory cells, which are arrayed in the X-axis direction. An n-well type of well contact region is formed in this active region 15. Thus, n-wells corresponding to 32 memory cells are connected to a $V_{DD}$ wire (power line) by this well contact region.

One active region 17 is formed for every two memory cells, which are arrayed in the Y-axis direction. A p-well type of well contact region is formed in this active region 17. Thus, p-wells corresponding to two memory cells are connected to a $V_{SS}$ wire (ground line) by this well contact region.

Each of the active regions 11, 13, 15, and 17 is separated from all of the other active regions by the element isolation regions 19 (of a depth of 400 nm, for example). The element isolation regions 19 provide shallow trench isolation (STI), by way of example.

Sections taken along the lines B1–B2 and C1–C2 of FIG. 2 are shown in FIG. 14 and FIG. 15, respectively. These sections show the active regions 11 and 13 and the element isolation regions 19.

The first conductive layer, which is positioned above this field, will now be described with reference to FIGS. 3, 11, 14, and 15.

FIG. 3 is a plan view of the first conductive layer, showing a plurality of the gate electrode layers 21a and 21b and a plurality of the sub word lines 23 that are disposed in this first conductive layer. The gate electrode layers 21a and 21b and the sub word lines 23 have a configuration formed of a silicide layer above a polysilicon layer, by way of example.

Each of the gate electrode layers 21a and 21b has a linear shape that extends in the Y-axis direction in FIG. 3. A pair of the gate electrode layers 21a and 21b is disposed in parallel within each memory cell region. The gate electrode layers 21a and 21b form the gate electrodes of the drive transistors $Q_3$ and $Q_4$ and the load transistors $Q_5$ and $Q_6$ of FIG. 1. The gate length of the drive transistors $Q_3$ and $Q_4$ is 0.18 μm, by way of example. The gate length of the load transistors $Q_5$ and $Q_6$ is 0.20 μm, by way of example.

Each of the sub word lines 23 has a linear shape that extends in the X-axis direction in FIG. 3. The sub word lines 23 are positioned on the drive transistor side. The sub word lines 23 are activated/deactivated by main word lines that are positioned in an upper layer. The sub word lines 23 form the gate electrodes of the transfer transistors $Q_1$ and $Q_2$ of FIG. 1. The gate length of the transfer transistors $Q_1$ and $Q_2$ is 0.24 μm, by way of example.

Sections taken through the first conductive layer along the lines B1–B2 and C1–C2 of FIG. 3 are shown in FIG. 14 and FIG. 15, respectively. These sections show the sub word lines 23 and the gate electrode layer 21b.

The description now turns to the source/drains formed in the active regions. As shown in FIG. 11, an $n^+$-type source/drain 11a is formed in each active region 11. Note that "source/drain" means a region that can function as either a source or a drain. A $p^+$-type source/drain 13a is formed in each active region 13. An $n^+$-type well contact region 15a is formed in the active region 15. A $p^+$-type well contact region 17a is formed in the active region 17.

Figure 4:
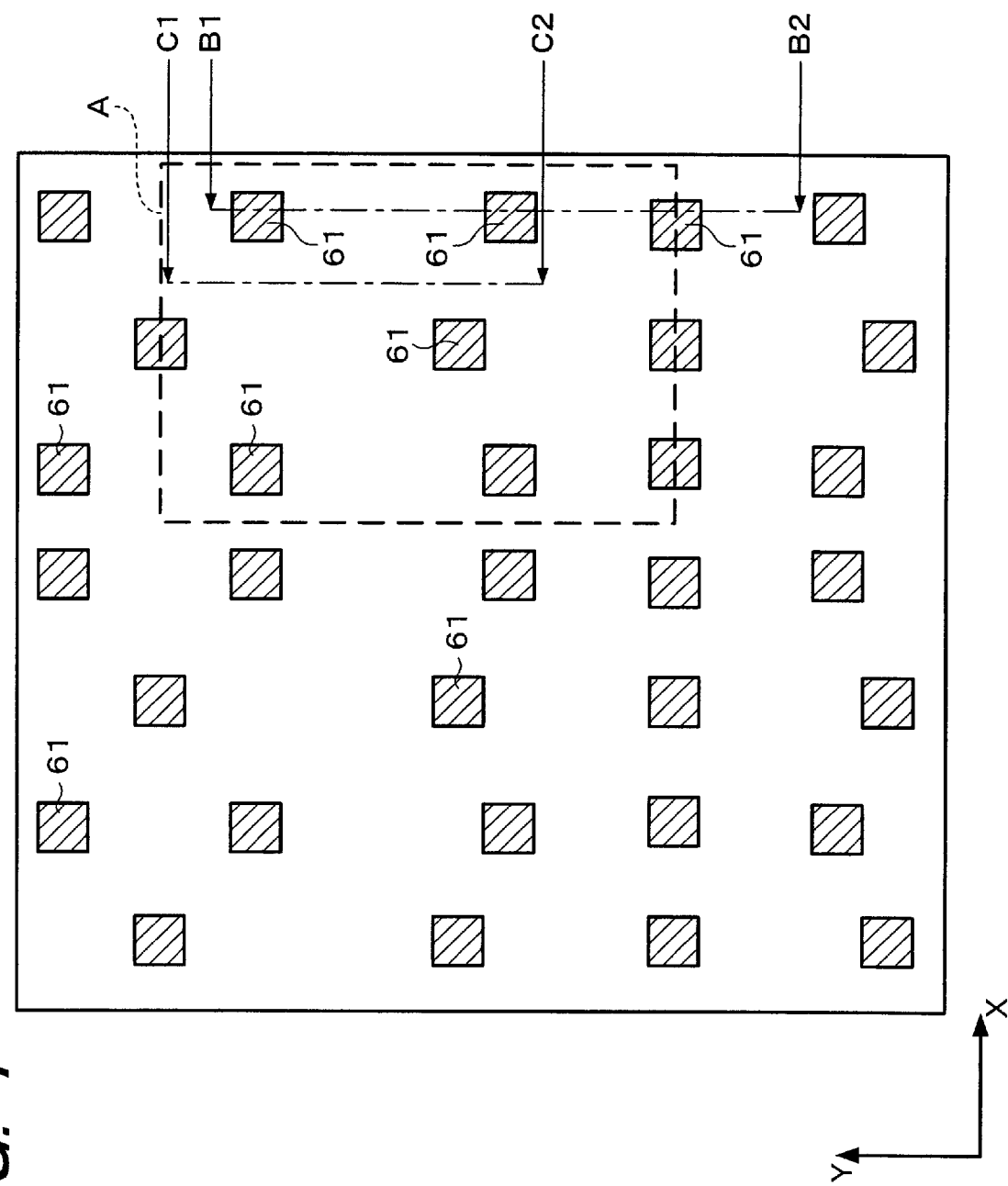
FIG. 4 is a plan view of plugs in this part of the memory cell array in accordance with this embodiment of the invention.

An interlayer dielectric layer (not shown in FIG. 11) of a material such as silicon oxide layer is formed so as to cover the field and the first conductive layer. This interlayer dielectric layer 65 is subjected to a flattening process, such as CMP, as shown in FIGS. 14 and 15. A plurality of contact holes 63 are formed in the interlayer dielectric layer 65 so as to expose each $n^+$-type source/drain 11a, etc. Plugs 61 are embedded in these contact holes 63. The plugs 61 are connected to the $n^+$-type source/drains 11a, the $p^+$-type source/drains 13a, the $n^+$-type well contact region 15a, and the $p^+$-type well contact region 17a. The pattern of these plugs 61 on the surface is shown in FIG. 4. A material such as tungsten can be used for the plugs 61. Note that the dimension of upper end portions of the holes 63 is 0.30 μm and the dimension of lower end portions thereof is 0.24 μm, by way of example.

{Second Conductive Layer}

The second conductive layer is positioned above the structure shown in FIG. 11. A plurality of the drain-drain contact layers 31a and 31b, a $V_{DD}$ wire 33, a plurality of BL (bit line, bit line/) contact pad layers 35a and 35b, and a plurality of local $V_{SS}$ wires 37 are disposed in the second conductive layer, as shown in FIG. 5. These components could be configured of an underlayer of titanium (of a thickness of 8.5 nm, for example) with a titanium nitride layer (of a thickness of 135 nm, for example) formed thereupon, by way of example.

Each of the drain-drain contact layers 31a and 31b has a linear shape that extends in the Y-axis direction in FIG. 5. The width of a main portion 31a3 of the drain-drain contact layer 31a is less than the widths of end portions 31a1 and 31a2 of the drain-drain contact layer 31a. Similarly, the width of a main portion 31b3 of the drain-drain contact layer 31b is less than the widths of end portions 31b1 and 31b2 of the drain-drain contact layer 31b. The widths of the main portion 31a3 and the main portion 31b3 are the minimum values permitted by the design rules. A pair of the drain-drain contact layers 31a and 31b is disposed in each memory cell region. As seen in plan view as in FIG. 1, a pair of the gate electrode layers 21a and 21b is positioned between the drain-drain contact layer 31a and the drain-drain contact layer 31b.

Each of the local $V_{SS}$ wires 37 is an example of a first local wire layer for a ground line and has a linear shape that extends in the Y-axis direction in FIG. 5. The widths of end portions of each of the local $V_{SS}$ wires 37 are greater than the width of the main portion of the local $V_{SS}$ wire 37. Each local $V_{SS}$ wire 37 is positioned between the end portion 31a2 of a drain-drain contact layer 31a and the end portion 31b2 of a drain-drain contact layer 31b. From this position, the local $V_{SS}$ wire 37 extends up to between the end portion 31a2 of the drain-drain contact layer 31a and the end portion 31b2 of the drain-drain contact layer 31b of the memory cell shown below in FIG. 5. One local $V_{SS}$ wires 37 is disposed for every two memory cells.

The BL contact pad layers 35a are examples of second layer contact pads for the bit lines, which function as pad layers for connecting together the bit lines and the $n^+$-type source/drains 11a (see FIG. 11). Similarly, the BL contact pad layers 35b are examples of large contact pads for the bit lines/, which function as pad layers for connecting together the bit lines/ and the $n^+$-type source/drains 11a.

Each of the BL contact pad layers 35a is positioned between the drain-drain contact layer 31a of one memory cell and the drain-drain contact layer 31a of the memory cell positioned therebelow in FIG. 5. In a similar manner, each of the BL contact pad layers 35b is positioned between the drain-drain contact layer 31b of one memory cell and the drain-drain contact layer 31b of the memory cell positioned therebelow in FIG. 5. The BL contact pad layers 35a and 35b are disposed so that there is one each for every two memory cells.

The $V_{DD}$ wire 33 is an example of a second layer power line. The $V_{DD}$ wire 33 has a linear shape that extends in the X-axis direction in FIG. 5. The $V_{DD}$ wire 33 extends so as to cross the $n^+$-type well contact region 15a (see FIG. 11) on a different level. The $V_{DD}$ wire 33 has branch portions 33a and 33b above the $n^+$-type well contact region 15a. Note that the $V_{DD}$ wire 33 could be formed in linear manner that extends in the Y-axis direction.

The drain-drain contact layers 31a and 31b, the $V_{DD}$ wire 33, BL contact pad layers 35a and 35b, and the local $V_{SS}$ wires 37 that are positioned in the second conductive layer as shown in FIG. 5 are connected to the plugs 61 shown in FIG. 11. These connections are denoted by contact portions 61m in FIG. 5.

A section taken through the second conductive layer along the line B1–B2 of FIG. 5 is shown in FIG. 14. This section shows the drain-drain contact layer 31b and the BL contact pad layers 35b.

An interlayer dielectric layer (not shown in FIG. 5) of a material such as silicon oxide layer is formed so as to cover the second conductive layer. This interlayer dielectric layer 71 is subjected to a flattening process, such as CMP, as shown in FIGS. 14 and 15. A plurality of through-holes 79 are formed in the interlayer dielectric layer 71 so as to expose each drain-drain contact layer 31b, etc., as shown in FIG. 14. Plugs 75 are embedded in the through-holes 79. Through-holes 77 are formed in the interlayer dielectric layers 71 and 65 to expose the gate electrode layers 21b, as shown in FIG. 15. Plugs 73 are embedded in the through-holes 77. The relationship between the plugs 73 and 75 in plan view is shown in FIG. 12.

Figure 6:
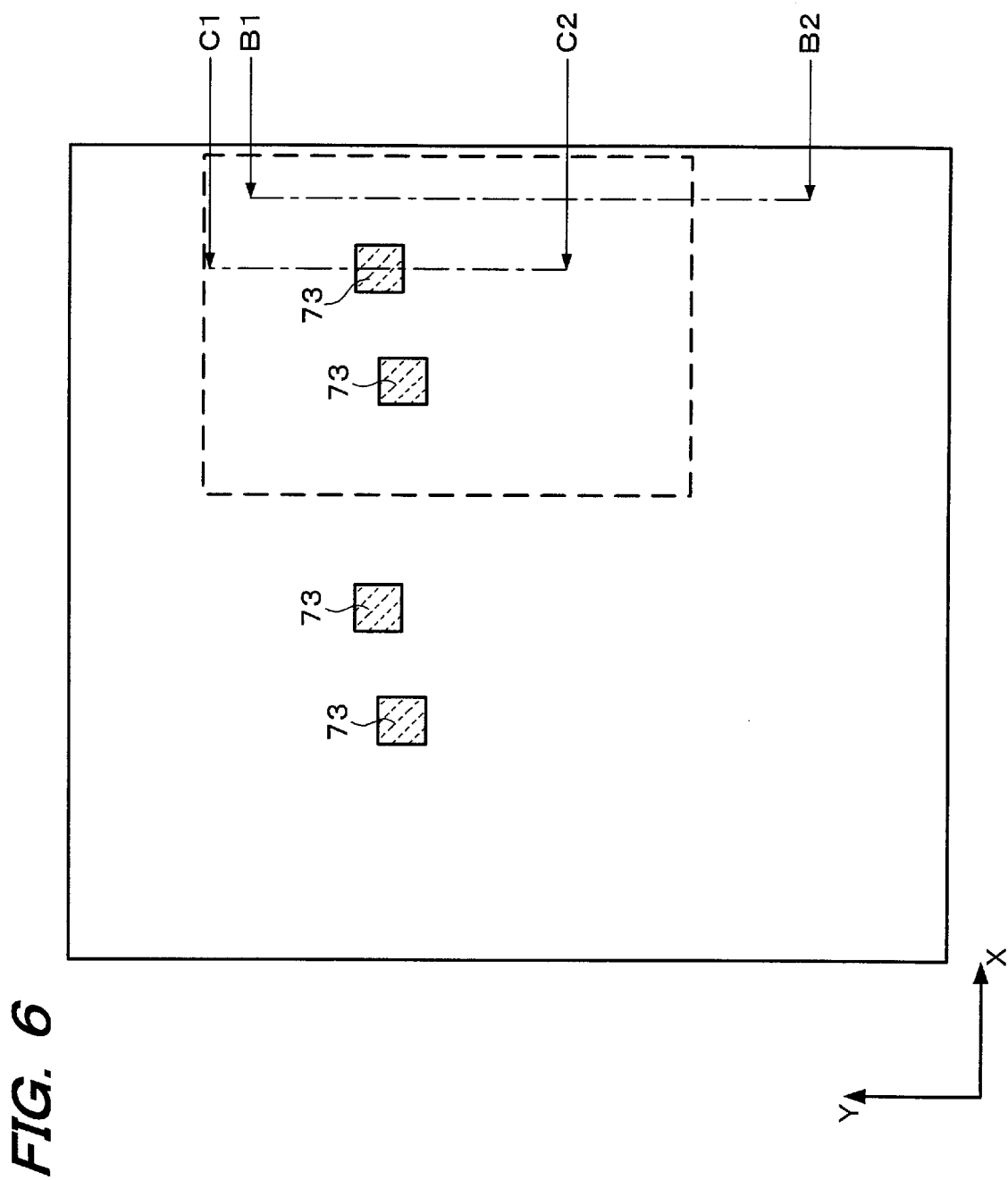
FIG. 6 is a plan view of plugs in this part of the memory cell array in accordance with this embodiment of the invention.

The description now turns to the plugs 73. The pattern of these plugs 73 on the surface is shown in FIG. 6. The plugs 73 are connected to the gate electrode layers 21a and 21b (see FIG. 3).

A section through one of the plugs 73 will now be described with reference to FIG. 15. Each plug 73 is embedded in one of the through-holes 77 that penetrate through the two interlayer dielectric layers 65 and 71. In this section, the plug 73 is connected to the gate electrode layer 21b. A material such as tungsten can be used for the plugs 73. Note that the dimension of upper end portions of the through-holes 77 is 0.32 μm, and the dimension of lower end portions thereof is 0.24 μm, by way of example.

Figure 7:
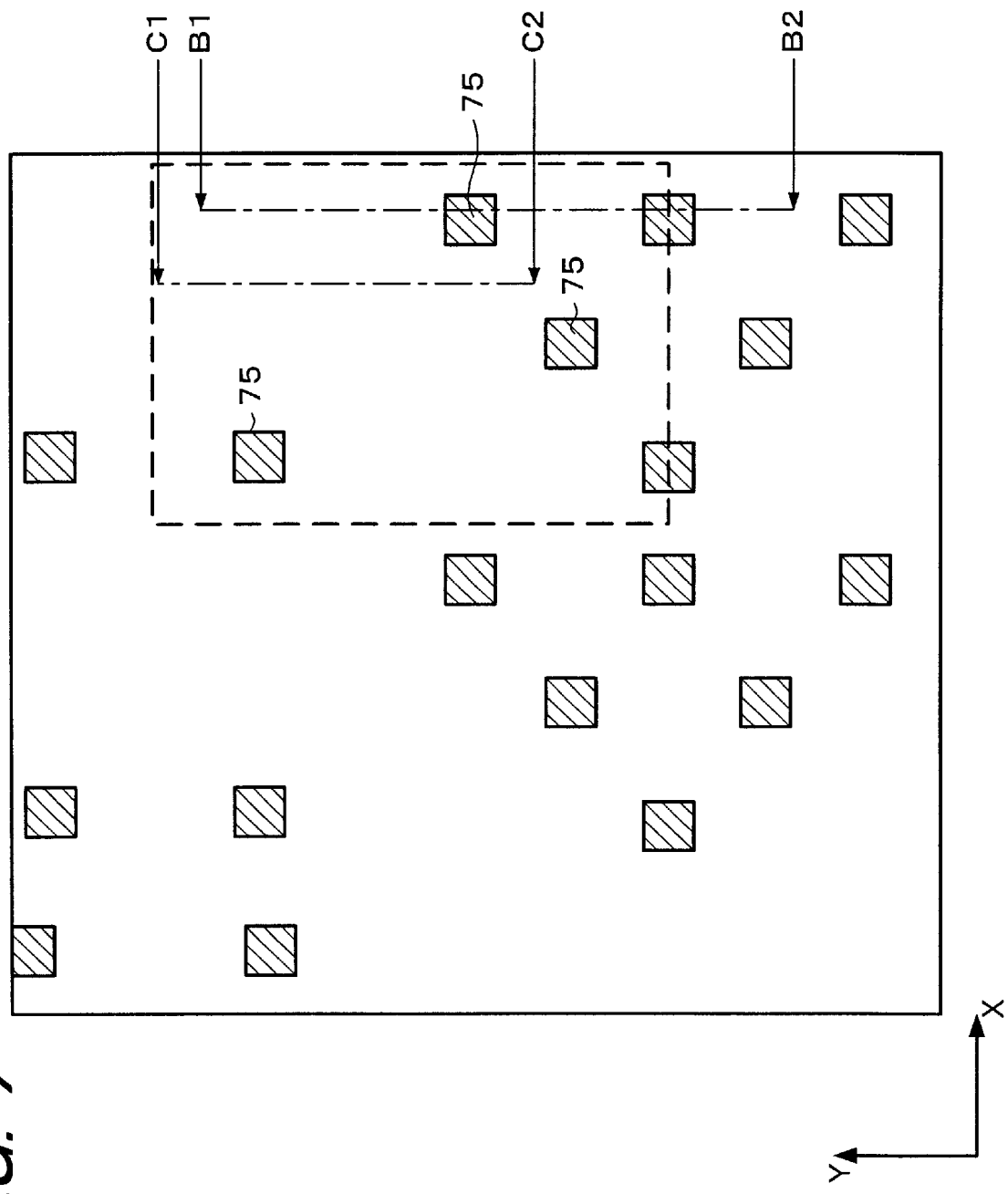
FIG. 7 is a plan view of plugs in this part of the memory cell array in accordance with this embodiment of the invention.

The description now turns to the plugs 75. The pattern of these plugs 75 on the surface is shown in FIG. 7. The plugs 75 are connected to the drain-drain contact layers 31a and 31b, the branch portions 33a and 33b of the $V_{DD}$ wire 33, the BL contact pad layers 35a and 35b, and the local $V_{SS}$ wires 37, as shown in FIG. 12. A section through the plugs 75 will now be described with reference to FIG. 14. Each plug 75 is embedded in one of the through-holes 79 that penetrate through the interlayer dielectric layer 71. In this section, the plugs 75 are connected to one of the drain-drain contact layers 31b and one of the BL contact pad layers 35b. A material such as tungsten can be used for the plugs 75. Note that the dimension of upper end portions of the through-holes 79 is 0.30 μm and the dimension of lower end portions thereof is 0.24 μm, by way of example.

{Third Conductive Layer}

The third conductive layer is positioned above the structure shown in FIG. 12. The plurality of drain-gate contact layers 41a and 41b, main word line 43, a plurality of BL contact pad layers 45a and 45b, a plurality of $V_{SS}$ contact pad layers 47, and a plurality of $V_{DD}$ contact pad layers 49 are disposed in the third conductive layer, as shown in FIG. 8. These components could be configured of a multi-layer stack of a titanium nitride layer, an aluminum-copper alloy layer, a titanium layer, and a titanium nitride layer, formed in that sequence from the bottom, by way of example.

Each drain-gate contact layer 41a has a main portion 41a3 and two end portions 41a1 and 41a2. The main portion 41a3 extends in the X-axis direction in FIG. 8. The first end portion 41a1 bends towards the corresponding drain-gate contact layer 41b. Similarly, each drain-gate contact layer 41b has a main portion 41b3 and two end portions 41b1 and 41b2. The main portion 41b3 extends in the X-axis direction in FIG. 8. The first end portion 41b1 bends towards the corresponding drain-gate contact layer 41a. A pair of the drain-gate contact layers 41a and 41b is disposed within each memory cell region.

The BL contact pad layers 45a, which is an example of the third layer contact pad for a bit line, function as pad layers for connecting together the bit lines and the $n^+$-type source/drains 11a. Similarly, the BL contact pad layers 45b, which is an example of the third layer contact pad for a bit line, function as pad layers for connecting together the bit lines/ and the $n^+$-type source/drains 11a. The BL contact pad layers 45a and 45b are disposed so that there is one each for every two memory cells.

Each of the $V_{SS}$ contact pad layers 47 is an example of a third layer local wire for a ground line which extends in the Y-axis direction in FIG. 8 and has two end portions. Each $V_{SS}$ contact pad layer 47 is positioned between a BL contact pad layer 45a and a BL contact pad layer 45b. The $V_{SS}$ contact pad layers 47 are disposed so that there is one for every two memory cells.

The main word line 43 extends in a linear fashion in the X-axis direction in FIG. 8. The main word line 43 is positioned above the $V_{DD}$ wire 33 shown in FIG. 5. The $V_{DD}$ contact pad layers 49 are positioned above the branch portions 33a and 33b of the $V_{DD}$ wire 33 shown in FIG. 5.

The first end portion 41a1 of each drain-gate contact layer 41a and the first end portion 41b1 of each drain-gate contact layer 41b are connected to the plugs 73 shown in FIG. 12. These connections are denoted by contact portions 73m in FIG. 8. The second end portion 41a2 of each drain-gate contact layer 41a, the second end portion 41b2 of each drain-gate contact layer 41b, the BL contact pad layers 45a and 45b, the $V_{SS}$ contact pad layers 47, and the $V_{DD}$ contact pad layers 49 are connected to the plugs 75 shown in FIG. 12. These connections are denoted by contact portions 75m in FIG. 8.

Sections taken through the third conductive layer along the lines B1–B2 and C1–C2 of FIG. 8 are shown in FIG. 14 and FIG. 15, respectively. These sections show the drain-gate contact layers 41a and 41b, one of the BL contact pad layers 45b, and the main word line 43. A hard mask layer 40 formed of a silicon oxide layer is formed above the third conductive layer comprising these components. The hard mask layer 40 acts as a mask for the patterning of the third conductive layer. If resist were to be used as the mask, a reduction in size of the memory cell will make it difficult to pattern that third conductive layer.

Figure 9:
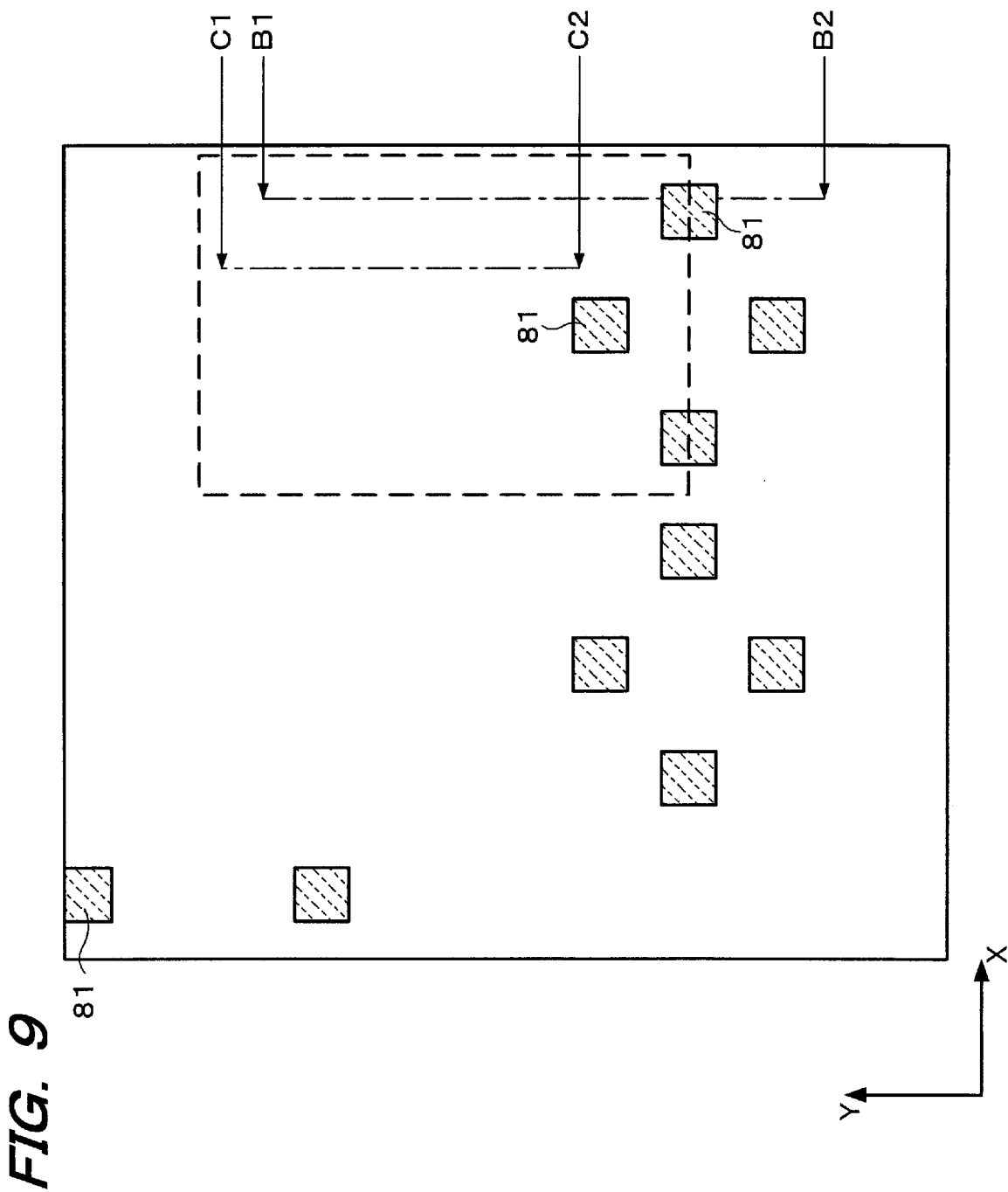
FIG. 9 is a plan view of plugs in this part of the memory cell array in accordance with this embodiment of the invention.

An interlayer dielectric layer of a material such as silicon oxide layer is formed so as to cover the third conductive layer. This interlayer dielectric layer 85 is subjected to a flattening process, such as CMP, as shown in FIGS. 14 and 15. Through-holes 83 are formed in the interlayer dielectric 85 so as to expose each BL contact pad layer 45a, etc. Plugs 81 are embedded in the through-holes 83. A plan view thereof is shown in FIG. 13. The plugs 81 are connected to the BL contact pad layers 45a and 45b, the $V_{SS}$ contact pad layers 47, and the $V_{DD}$ contact pad layers 49, as shown in FIG. 13. The pattern of these plugs 81 on the surface is shown in FIG. 9. A material such as tungsten is used for the plugs 81. Note that the dimension of upper end portions of the through-holes 83 is 0.36 μm and the dimension of lower end portions thereof is 0.28 μm, by way of example.

{Fourth Conductive Layer}

The fourth conductive layer is positioned above the structure shown in FIG. 13. A plurality of bit lines 51, a plurality of bit lines/53, a plurality of $V_{SS}$ wire 55, and a $V_{DD}$ wire 57 are disposed in the fourth conductive layer, as shown in FIG. 10. These extend in a linear fashion in the Y-axis direction in FIG. 10. Each of these components is connected to one of the plugs 81 shown in FIG. 13. These connections are denoted by contact portions 81m in FIG. 10. The bit lines 51 could be configured of a multi-layer stack of a titanium nitride layer, an aluminum-copper alloy layer, and a titanium nitride layer, formed in that sequence from the bottom, by way of example.

A section taken through the fourth conductive layer along the line B1–B2 of FIG. 10 is shown in FIG. 14. This section shows the bit lines/ 53. Signals that complement the signals that flow through the bit lines 51 flow through the bit lines/ 53. The $V_{DD}$ wire 57 is an example of a fourth layer power line. Note that this embodiment of the invention has a configuration that is provided with this $V_{DD}$ wire, but it could equally well have a configuration without the $V_{DD}$ wire 57.

This completes the detailed description of the configuration of this embodiment of the invention. Note that the patterns shown in FIGS. 1 to 13 are governed by the design. These patterns have corner portions. However, optical proximity effects will dictate that the corner portions of patterns formed on a semiconductor substrate in practice will be curved.

{Main Effects of This Embodiment}

The description now turns to the main effects of this embodiment of the invention.

(1) This embodiment of the present invention makes it possible to reduce the dimensions of SRAM. The reasons therefor are discussed below. In this embodiment of the invention, information is stored by memory cell flip-flops. Each flip-flop is configured by connecting an input terminal (gate electrode) of a first inverter to an output terminal (drain) of a second inverter, and by connecting an input terminal (gate electrode) of the second inverter to an output terminal (drain) of the first inverter. In other words, the flip-flop is configured by cross-coupling the first inverter and the second inverter.

If the flip-flop is fabricated in two layers, the cross-coupling connection could be enabled by having the drain-drain contact layer for connecting together the drains of the inverters and the drain-gate contact layer for connecting the gate of one inverter to the drain of the other inverter in the same layer, by way of example.

However, such a configuration would mean that this conductive layer would be formed to extend over a region in which the drain of the first inverter is positioned, a region in which the gate of the second inverter is positioned, and a connecting region therebetween. Thus, this conductive layer would require a pattern having three end portions (such as a pattern with branch portions, such as a T-shaped or small h-shaped pattern) or a spiral pattern with interlocking arm portions. Note that an example of a T-shaped pattern is disclosed in FIG. 1 of Japanese Patent Application Laid-Open No. 10-41409. An example of a small h-shaped pattern is disclosed in FIG. 4(b) on page 203 of the IEDM Tech. Digest (1998), by M. Ishida, et al. An example of a spiral pattern is disclosed in FIG. 3(b) on page 203 of the IEDM Tech. Digest (1998), by M. Ishida, et al. If such a complicated pattern were reduced in size, it would be difficult to reproduce that shape accurately in a photoetching step, so that the desired pattern will not be obtained and thus it will not be possible to reduce the memory cell size.

This embodiment of the present invention ensures that the gate electrode layers (21a and 21b) that form the gates of the CMOS inverters, the drain-drain contact layers (31a and 31b) that connect together the drains of the CMOS inverters, and the drain-gate contact layers (41a and 41b) that connect the gate of one CMOS inverter to the drain of the other CMOS inverter are formed in different layers. Three layers are therefore used in the fabrication of each flip-flop. This makes it possible to simplify the pattern of each layer (by making them linear, by way of example), in comparison with a flip-flop formed by using two layers. This embodiment of the invention therefore makes it possible to simplify the pattern of each layer and thus create even more densely packed SRAM having memory cells in the 0.18 µm range, with a memory cell size of 4.5 µm² or less.

(2) The positioning of the conductive layers necessary for the SRAM structure affects the attributes of the SRAM. In this embodiment of the present invention, the conductive layers necessary for the SRAM structure are positioned in a well-balanced manner. It is therefore possible to improve the various attributes required of SRAM, such as compact dimensions, reliability, stability, and speed.

What is claimed is:

1. A semiconductor memory device provided with a memory cell having a first load transistor, a second load transistor, a first drive transistor, a second drive transistor, a first transfer transistor, and a second transfer transistor, the semiconductor memory device comprising:

(a) a first active region in which the first and the second load transistors are formed;

(b) a second active region in which the first and the second drive transistors and the first and the second transfer transistors are formed;

(c) a first gate electrode layer which is positioned in a first conductive layer being an upper layer of the first and the second active regions and which includes gate electrodes of the first load transistor and the first drive transistor;

(d) a second gate electrode layer which is positioned in the first conductive layer and which includes gate electrodes of the second load transistor and the second drive transistor;

(e) a sub word line which is positioned in the first conductive layer and which comprises gate electrodes of the first and the second transfer transistors;

(f) a first drain-drain contact layer which is positioned in a second conductive layer being an upper layer of the first conductive layer and which connects a drain of the first load transistor to a drain of the first drive transistor;

(g) a second drain-drain contact layer which is positioned in the second conductive layer and which connects a drain of the second load transistor to a drain of the second drive transistor;

(h) a power line which is positioned in the second conductive layer and which connects sources of the first and the second load transistors;

(i) a second layer contact pad for a bit line, which is positioned in the second conductive layer and is connected to the first transfer transistor;

(j) a second layer contact pad layer for a bit line/, which is positioned in the second conductive layer and is connected to the second transfer transistor;

(k) a second layer local wire for a ground line, which is positioned in the second conductive layer and is connected to sources of the first and the second drive transistors;

(1) a first drain-gate contact layer which is positioned in a third conductive layer being an upper layer of the second conductive layer and which connects the first drain-drain contact layer to the second gate electrode layer;

(m) a second drain-gate contact layer which is positioned in the third conductive layer and which connects the second drain-drain contact layer to the first gate electrode layer;

(n) a main word line which is positioned in the third conductive layer;

(o) a third layer contact pad for a bit line, which is positioned in the third conductive layer and which is connected to the second contact pad layer for a bit line;

(p) a third layer contact pad for a bit line/, which is positioned in the third conductive layer and which is connected to the second contact pad layer for a bit line/;

(q) a third layer local wire for a ground line, which is positioned in the third conductive layer and is connected to the second layer local wire for a ground line;

(r) a bit line which is positioned in a fourth conductive layer being an upper layer of the third conductive layer and which is connected to the first transfer transistor by the second layer contact pad for a bit line and the third layer contact pad for a bit line;

(s) a bit line/ which is positioned in the fourth conductive layer and which is connected to the second transfer transistor by the second layer contact pad for a bit line/ and the third layer contact pad for a bit line/; and (t) a ground line which is positioned in the fourth conductive layer and which is connected to sources of the first and the second drive transistors by the second layer local wire and the third layer local wire.

2. The semiconductor memory device as defined in claim 1, further comprising:
- an n-type well in which the first active region is formed;
- a p-type well in which the second active region is formed;
- an n-type well contact region which is formed in the n-type well and which is connected to the second layer power line; and
- a p-type well contact region which is formed in the p-type well and which is connected to the ground line.

3. The semiconductor memory device as defined in claim 2,
wherein the p-type well contact region is connected to the ground line by the second layer local wire for a ground line and the third layer local wire for a ground line.

4. The semiconductor memory device as defined in claim 2, further comprising:
- a contact pad layer for a power line, which is positioned in the third conductive layer; and
- a fourth layer power line which is positioned in the fourth conductive layer;
wherein the main word line extends in a first direction,
wherein the second layer power line extends in the first direction, overlaps the main word line on a different level, and has a branch portion, and
wherein the fourth layer power line extends in a second direction and is connected to the branch portion by the contact pad layer for a power line.

5. The semiconductor memory device as defined in claim 1,
wherein the sub word line, the second layer power line, and the main word line extend in the first direction, and
wherein the bit line, the bit line/, and the ground line extend in a second direction.

6. The semiconductor memory device as defined in claim 1,
wherein the first and the second gate electrode layers and the first and the second drain-drain contact layers extend in the same direction, and
wherein the first and the second gate electrode layers are positioned between the first drain-drain contact layer and the second drain-drain contact layer, as seen in plan view of the memory cell.

7. A semiconductor memory device provided with a memory cell having an n-type first drive transistor, an n-type second drive transistor, a p-type first load transistor, a p-type second load transistor, an n-type first transfer transistor, and an n-type second transfer transistor, the semiconductor memory device comprising: a p-type well; an n-type well; a first conductive layer; a second conductive layer; a third conductive layer; and a fourth conductive layer, wherein:
- the first conductive layer is formed on the p-type well and n-type well, the second conductive layer is formed on the first conductive layer, the third conductive layer is formed on the second conductive layer, and the fourth conductive layer is formed on the third conductive layer;
- the first drive transistor, the second drive transistor, the first transfer transistor, and the second transfer transistor are positioned in the p-type well;
- the first load transistor and the second load transistor are positioned in the n-type well;
- a first gate electrode layer, a second gate electrode layer, and a sub word line are positioned in the first conductive layer;
- a first drain-drain contact layer, a second drain-drain contact layer, a first power line, a first contact pad layer, a second contact pad layer, and a third contact pad layer are positioned in the second conductive layer;
- a first drain-gate contact layer, a second drain-gate contact layer, a main word line, a fourth contact pad layer, a fifth contact pad layer, and a sixth contact pad layer are positioned in the third conductive layer;
- a first bit line, a second bit line, and a ground line are positioned in the fourth conductive layer;
- the first gate electrode layer includes gate electrodes of the first drive transistor and the first load transistor;
- the second gate electrode layer includes gate electrodes of the second drive transistor and the second load transistor;
- the sub word line extends in the first direction;
- the first drain-drain contact layer connects a drain of the first drive transistor to a drain of the first load transistor;
- the second drain-drain contact layer connects a drain of the second drive transistor to a drain of the second load transistor;
- the first and the second gate electrode layers are positioned between the first drain-drain contact layer and the second drain-drain contact layer, as seen in plan view of the memory cell;
- the first power line is connected to a well contact region of the n-type well, a source of the first load transistor, and a source of the second load transistor;
- the first contact pad layer is used for connecting the first bit line to a source/drain region of the first transfer transistor;
- the second contact pad layer is used for connecting the second bit line to a source/drain region of the second transfer transistor;
- the third contact pad layer is used for connecting a well contact region of the p-type well, a source of the first drive transistor, and a source of the second drive transistor to the ground line;
- the first drain-gate contact layer connects the first drain-drain contact layer to the second gate electrode layer;
- the second drain-gate contact layer connects the second drain-drain contact layer to the first gate electrode layer;
- the main word line extends in the first direction;
- the fourth contact pad layer is used for connecting the first bit line to the source/drain region of the first transfer transistor;
- the fifth contact pad layer is used for connecting the second bit line to the source/drain region of the second transfer transistor;
- the sixth contact pad layer is used for connecting the well contact region of the p-type well, the source of the first drive transistor, and the source of the second drive transistor to the ground line;
- the first bit line extends in a second direction that crosses the first direction at right angle; and
- the second bit line extends in the second direction.

8. The semiconductor memory device as defined in claim 7, further comprising a second power line,
wherein the second power line is disposed in the vicinity of the memory cell,
wherein the second power line is positioned in the fourth conductive layer, and wherein the second power line is connected to the first power line.

9. The semiconductor memory device as defined in claim 8, wherein:

the second power line extends in the second direction;

the first power line extends in the first direction;

the first power line overlaps the main word line on a different level;

the first power line has a branch portion that extends in the second direction;

a seventh contact pad layer is positioned in the third conductive layer; and the branch portion and the seventh contact pad layer are used for connecting the first power line to the second power line.

10. The semiconductor memory device as defined in claim 9, wherein the seventh contact pad layer and the branch portion are positioned above the well contact region of the n-type well.

11. The semiconductor memory device as defined in claim 7, wherein the first power line extends in the first direction.

12. The semiconductor memory device as defined in claim 7, wherein the ground line extends in the second direction.

13. The semiconductor memory device as defined in claim 7, wherein the first and the second gate electrode layers extend in the second direction.

14. The semiconductor memory device as defined in claim 7, wherein the first and the second drain-drain contact layers extend in the second direction.

15. The semiconductor memory device as defined in claim 7, wherein the third contact pad layer extends in the second direction.

16. The semiconductor memory device as defined in claim 7, wherein the first gate electrode layer, the second gate electrode layer, the first drain-drain contact layer, and the second drain-drain contact layer are disposed in parallel to one another and are each formed in a linear pattern.

17. The semiconductor memory device as defined in claim 7, wherein a memory cell size is 4.5 $\mu m^2$ or less.

* * * * *